United States Patent [19]

Holler et al.

[11] Patent Number: 4,780,424

[45] Date of Patent: Oct. 25, 1988

[54] PROCESS FOR FABRICATING ELECTRICALLY ALTERABLE FLOATING GATE MEMORY DEVICES

[75] Inventors: Mark A. Holler, Palo Alto; Simon M. Tam, San Mateo, both of Calif.

[73] Assignee: Intel Corporation, Santa Clara, Calif.

[21] Appl. No.: 101,642

[22] Filed: Sep. 28, 1987

[51] Int. Cl.$^4$ .................. H01L 21/425; H01L 29/78
[52] U.S. Cl. .................................. 437/29; 437/30; 437/43; 357/23.5; 357/23.11
[58] Field of Search .................. 437/29, 30, 43; 357/23.5, 23.11

[56] References Cited

U.S. PATENT DOCUMENTS

| | | | |
|---|---|---|---|
| 4,214,359 | 7/1980 | Kahng | 357/23.11 |
| 4,258,466 | 3/1981 | Kuo et al. | 437/43 |
| 4,435,895 | 3/1984 | Parrillo et al. | 357/23.11 |
| 4,451,904 | 5/1984 | Sugiura et al. | 357/23.5 |
| 4,561,004 | 12/1985 | Kuo et al. | 357/23.5 |

FOREIGN PATENT DOCUMENTS

| | | | |
|---|---|---|---|
| 0156369 | 12/1980 | Japan . | |
| 0013772 | 1/1982 | Japan | 437/43 |
| 0106166 | 7/1982 | Japan | 357/23.5 |
| 8202283 | 7/1982 | PCT Int'l Appl. | 437/43 |
| 2080024 | 1/1982 | United Kingdom | 357/23.5 |

Primary Examiner—Olik Chaudhuri
Attorney, Agent, or Firm—Blakely, Sokoloff, Taylor & Zafman

[57] ABSTRACT

A process for fabricating contactless electrically programmable and electrically erasable memory cells of the flash EPROM type. The contactless cells use elongated source and drain regions disposed beneath field oxide regions. The drain regions are shallow compared to the source regions. The source regions have more graded junctions. Floating gates are formed over a tunnel oxide (120 Å thick) between the source and drain regions with word lines being disposed perpendicular to the source and drain regions. One dimension of the floating gates is formed after the word lines have been patterned by etching the first layer of polysilicon in alignment with the word lines.

9 Claims, 3 Drawing Sheets

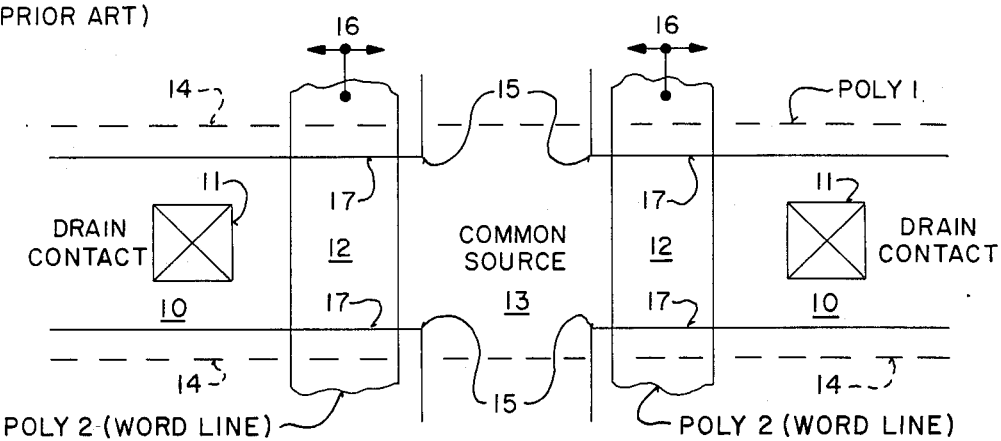
FIG_1 (PRIOR ART)
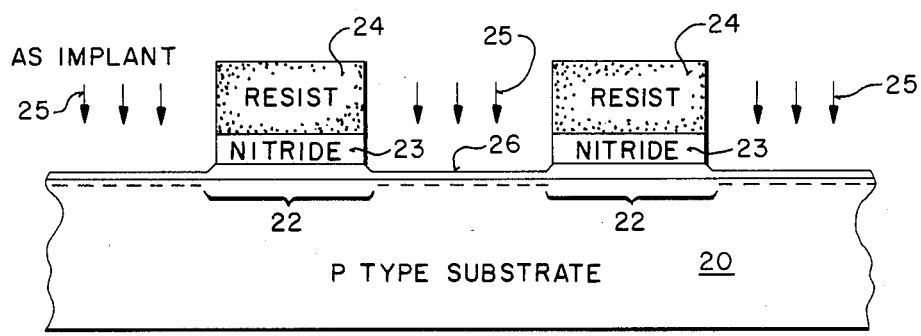
FIG_2
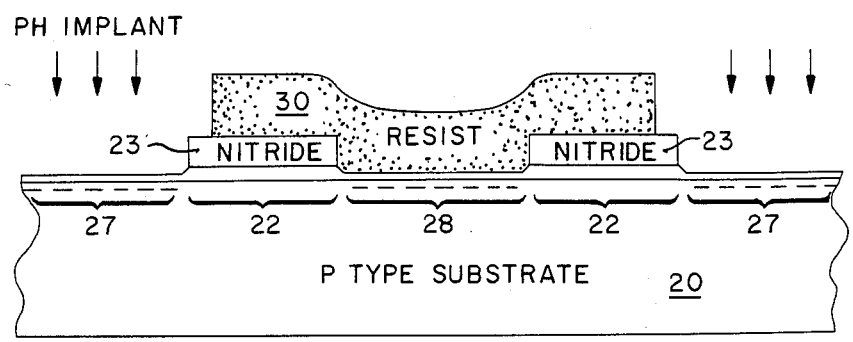
FIG 3

FIG_4
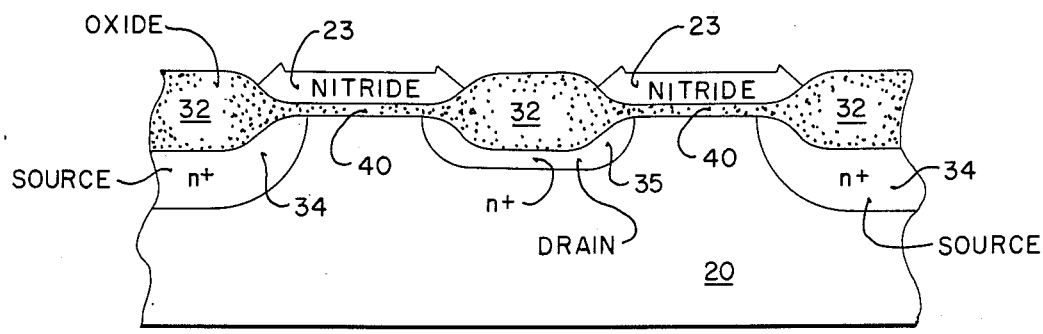
FIG_5
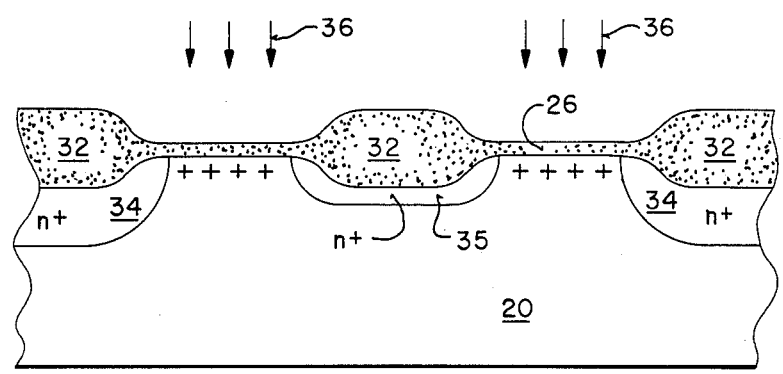
FIG_6
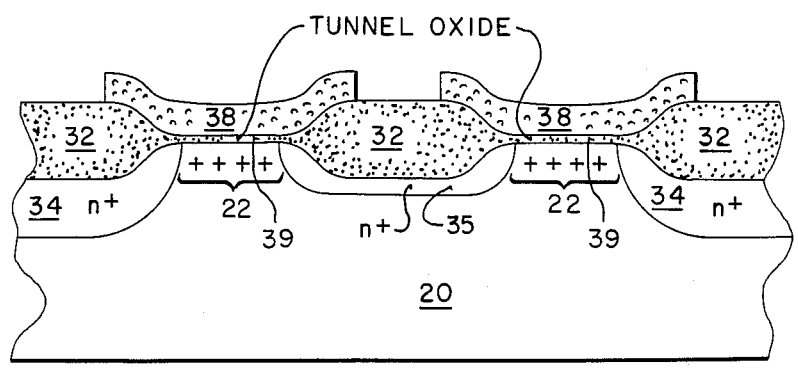

FIG_7
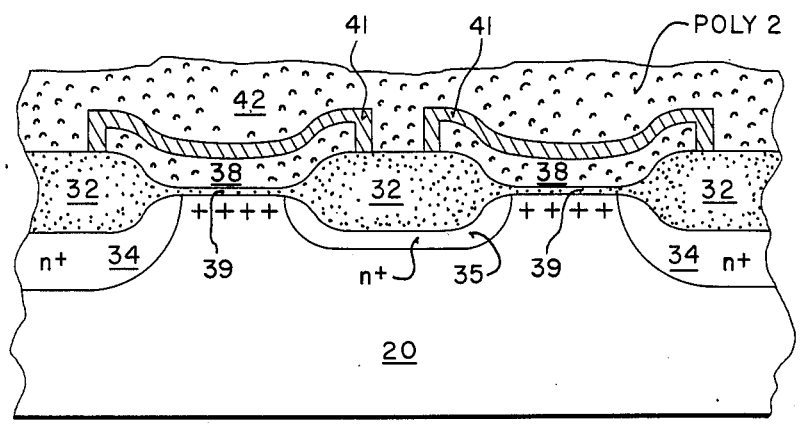
FIG_8
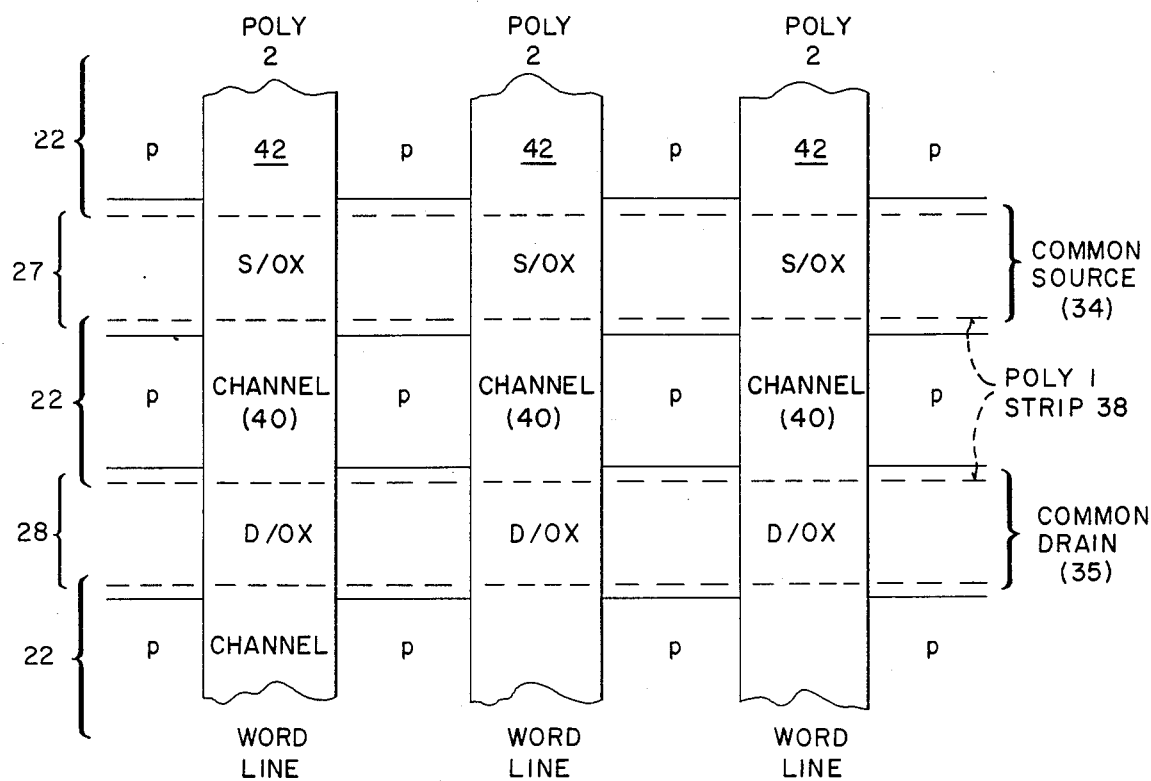

PROCESS FOR FABRICATING ELECTRICALLY ALTERABLE FLOATING GATE MEMORY DEVICES

BACKGROUND OF THE PRESENT INVENTION

1. Field of the Invention

The invention relates to the field of semiconductor memory devices employing floating gates and the processes and methods for fabricating these devices.

2. Prior Art

One class of non-volatile semiconductor memories employs floating gates, that is, gates which are completely surrounded by an insulative layer such as silicon dioxide. Typically, a polycrystalline silicon (polysilicon layer is used to form floating gates. These gates are electrically charged, most often with electrons by transferring charge into and from the gates through a variety of mechanisms. The presence or absence of this charge represents stored, binary information. An early example of such a device is shown in U.S. Pat. No. 3,500,142.

The earliest commercial electrically programmable readonly memories (EPROMs) employing floating gates used p-channel devices which are programmed through avalanche injection. Charge is removed from these devices by exposing the array to electromagnetic radiation such as ultraviolet light (See U.S. Pat. No. 3,660,819). Later, EPROMs used n-channel devices and relied on channel injection as the mechanism for transferring charge into the floating gates (See U.S. Pat. No. 3,984,822). Many EPROMs fabricated with current technology still rely on channel injection for transferring charge into the floating gates and radiation for erasing the gates.

Another category of semiconductor floating gate memory devices are both electrically programmable and electrically erasable. Such a device is shown in U.S. Pat. No. 4,203,158. Tunneling is used through a thin oxide region for transferring charge into and from the floating gates. Such memories are commercially available such as the Intel 2816. In these memories, two devices are required for each memory cell. One device includes the floating gate and the other (typcially an ordinary field-effect transistor) is used to isolate the floating gate device during various memory cycles.

A more recent category of floating gate memory devices uses channel injection for charging floating gates and tunneling for removing charge from the gates. Here, each memory cell comprises only a single device and the entire memory array is erased at one time, that is, individual cells or groups of cells are not separately erasable as in current EEPROMs. These memories are sometimes referred to as "flash" EPROMs or EEPROMs. An example of these devices is disclosed in copending application Ser. No. 892,446, filed Aug. 4, 1986, entitled "Low Voltage EEPROM Cell" which application is assigned to the assignee of the present application. The devices described in this copending application use asymmetrical source/drain regions.

In some cases, the floating gate memory devices are fabricated in arrays where each device or device pair is separated from other devices by field oxide regions. An example of this is shown in U.S. Pat. No. 4,114,255. In these arrays, a metal contact is needed for each device or device-pair, these metal contacts limit the reduction of device area. Another problem associated with fabricating cells of the type described in the above-mentioned patent application is described in conjunction with FIG. 1 of this application.

Other arrays substantially reduce the metal contacts needed by using elongated source/drain regions which are disposed beneath oxide regions. These arrays sometimes referred to as having "buried bit lines" or using "contactless cells" requires virtual ground circuitry for sensing and programming. An example of this type of array is shown in U.S. Pat. No. 4,267,632 with virtual ground circuitry being shown in U.S. Pat. No. 4,460,981. Other examples of memories employing this technology are shown in U.S. Pat. Nos. 4,112,509; 4,148,207; 4,151,021; 4,282,446; 4,373,248; 4,493,057; and 4,503,524. This technology is also described in *Electronics* "Contactless Arrays for EPROMS Arrive Just in Time", Nov. 27, 1986, beginning at page 70; IEDM 86 "High Density Contactless Self-Aligned EPROM Cell Array Technology", beginning at page 592; and *ISSCC* 87, Section VII: Non-Volatile Memory, "A 1 Mb CMOS EPROM with a 13.5 m2 cell".

As will be seen, the present invention provides an electrically erasable and programmable cell of the variety referred to as the contactless cell.

SUMMARY OF THE INVENTION

A process for fabricating a memory array of floating gate memory devices on a silicon substrate is described. Spaced-apart parallel strips of silicon nitride are formed on the substrate over elongated first substrate regions. These elongated strips define elongated parallel spaced-apart second substrate regions between the strips. The second regions are subjected to doping steps such that alternate ones of these second regions are doped with an n-type dopant to a first level of doping and the others of the regions are doped with an n-type dopant to a second level of doping, the first and second levels of doping being different. Then an oxide is grown over these doped second regions, in effect, burying the second regions. After the silicon nitride strips are removed, a plurality of first gate members are formed from a first layer of polysilicon over the first regions. The first gate members are the floating gates of the memory devices, and hence, are insulated from the second regions. Elongated second gate members are formed from a second layer of polysilicon. These second gate members are generally perpendicular to the first and second regions. These second gate members are the control gates for the memory devices.

BRIEF DESCRIPTION OF THE DRAWINGS

FIG. 1 is a partial plan view of a prior art memory array used to illustrate a problem occurring with the prior art array.

FIG. 2 is a cross-sectional elevation view of a substrate which includes strips of silicon nitride, this veiw also illustrates the ion implantation of arsenic into the regions formed between the strips.

FIG. 3 illustrates the substrate of FIG. 2 after photoresist masking members have been formed between alternate ones of the regions and during a second doping step.

FIG. 4 illustrates the substrate of FIG. 3 after an oxide has been grown over the regions.

FIG. 5 illustrates the substrate of FIG. 4 after the silicon nitride strips have been removed and a gate oxide grown over channel regions and during another implantation step.

FIG. 6 illustrates the substrate of FIG. 5 after first gate members have been formed.

FIG. 7 illustrates the substrate of FIG. 6 after second gate members have been formed.

FIG. 8 is a plan view of a portion of an array fabricated in accordance with the present invention.

DETAILED DESCRIPTION OF THE PRESENT INVENTION

A process for fabricating electrically programmable and electrically erasable floating gate memory devices is described. In the following description, numerous specific details are set forth such as specific doping levels, etc., in order to provide a thorough understanding of the present inventoin. It will be obvious, however, to one skilled in the art that these specific details need not be employed to practice the present invention. In other instances, well-known processing steps are not described in detail in order not to unnecessarily obscure the present invention.

PRIOR ART

In FIG. 1, a prior art electrically erasable EPROM cell (Flash EPROM/ETOX) is shown in plan view to illustrate a problem associated with these cells. The cell includes a source region 13 which is shared by two adjacent cells. Each of the adjacent cells includes a drain region 10 and a drain contact 11. The channel region for each of the cells lies below the polysilicon word lines 12.

In the fabrication of the device, a first layer of polysilicon is disposed on the silicon substrate and generally etched along the dotted lines 14. Subsequently, the word lines 12 are fabricated from a second layer of polysilicon, and then the first layer of polysilicon is plasma etched in alignment with these word lines. This provides the floating gates from the first layer of polysilicon. These gates are disposed above the channel regions beneath the word lines 12. Field isolation is provided through relatively thick field-oxide regions 17 which are grown during "front-end" processing.

The cell of FIG. 1 is programmed, that is, charge is placed into the floating gate through hot-electron injection from the channel near the drain region. Charge is removed by Fowler-Nordheim tunneling across the source region/floating gate overlap.

There are problems associated with the cell of FIG. 1. First, undesirable rounding occurs at the corners 15. This rounding is inherent in the lithography and field oxidation process. The floating gate-to-source tunneling area is increased because of this rounding, and thus, the associated capacitance is increased. Increased tunnel area capacitance degrades the tunnel erase process. There is always some misalignment of the polysilicon word line relative to the common source region 13, in the directions of arrows 16. The floating gates are defined in the direction of arrows 16 by the word lines 12. Therefore, the total floating gate to source tunneling area will vary because of this misalignment. And, in fact, for each cell pair, due to the mirrored nature of the array, asymmetry will exist between the floating gate-to-source tunneling area for each pair. This causes a bi-modal distribution of the erase threshold. Obviously, it is undesirable to have a wide erase threshold distribution which can result from this distribution.

As will be seen, the cell described below avoids the problems associated with the cell of FIG. 1.

PRESENTLY PREFERRED EMBODIMENT OF THE INVENTION

The memory cells of the present invention are fabricated using standard metal-oxide-semiconductor (MOS) processing. The array which contains the cells, in the currently preferred embodiment is fabricated of n-channel devices. The peripheral circuits can employ either n-channel devices or complementary MOS devices.

Initially the entire substrate is covered with a thin silicon dioxide layer and a thicker silicon nitride layer. The silicon nitride layer is patterned as needed for the peripheral circuits and following a boron implant, field oxide regions are grown for the peripheral circuits. The array for this processing remains protected by the silicon nitride layer.

Referring now to FIG. 2, the array region of a p-type monocrystalline silicon substrate 20 is illustrated covered with a silicon dioxide layer 26. In this array region and silicon nitride is now etched to form elongated, parallel, spaced-apart strips 23 by using ordinary photoresist members 24. The regions 22 underlying the nitride strips 23 and photoresist mask 24 are protected when the regions between the strips 23 are implanted with arsenic as indicated by the arrows 25. In the presently preferred embodiment, arsenic is implanted to a level of 1 to a level of $1 \times 10^{15}/cm^2$ to $5 \times 10^{15}/cm^2$. This forms elongated, parallel, spaced-apart doped regions in the substrate.

Next, as illustrated in FIG. 3, alternate ones of the elongated regions between the nitride members 23 (such as region 28) are covered with a photoresist members 30. (Note the photoresist members 24 may be removed before this occurs.) The regions 28 are thus protected by members 30, the regions 22 remain protected by the nitride strips 23, however, the elongated regions 27 are exposed and are implanted with an n-type dopant. The regions 27 in the currently preferred embodiment are doped with phosphorus to a level of approximately $0.5 \times 10^{15}/cm^2$ to $1 \times 10^{15}/cm^2$.

Another doping step (not illustrated) may be used to enhance programming for low voltage operation. After the photoresist members 30 are removed, additional masking members may be formed exposing regions 28 (drain regions). Boron is then implanted to a dose of about $1 \times 10^{14}/cm^2$. Also, the resistance of the regions 27 and 28 may be reduced by silicidation.

Now the substrate is subjected to high temperature oxidation step. Relatively thick field oxide regions are grown over the elongated doped regions 27 and 28 forming the oxide regions 32 shown in FIG. 4. In the currently preferred embodiment, these oxide regions are approximately 2000Å thick. Note the nitride members 23 prevent the formation of oxide in the channel regions 40. The high temperature oxidation step activates the arsenic and phosphorus dopants forming the source regions 34 (at the regions 27) and drain regions 35 (at regions 28). Note, as shown in FIG. 4, the source regions 34 are deeper than the drain regions 35. The phosphorus dopant diffuses more quickly into the silicon than arsenic, thus making these regions deeper. Moreover, as discussed in the above-referenced patent application, the dopant gradient associated with the source regions are more gradual (graded) than that associated with the drain regions.

After the silicon nitride members 23 are removed, the substrate is subjected to a threshold voltage adjusting implant. Boron, as indicated by lines 36, is implanted to a level of approximately $1 \times 10^{13}/\text{cm}^2$. (This channel implant may be lower if the optional boron drain implant previously discussed is used). The channel implant may consist of a combination of low energy and high energy boron implants.

The substrate is subjected to an etchant to remove the silicon dioxide layer from over the channel regions, this is done to permit growing of a high grade, gate oxide region over the channels. In the currently preferred embodiment, silicon dioxide is grown to a thickness of approximately 120Å. A relatively thin layer is grown since tunneling occurs through this layer. Special processing may also be used to enhance the quality of this gate oxide layer such as nitridation. The final gate oxide 39 is shown in FIG. 6.

After the gate oxide is formed, a layer of polysilicon is deposited over the substrate and the elongated, parallel, spacedapart polysilicon strips 38 are formed over the channel regions 22. These strips extend beyond the regions 22 and overlap the oxide regions 32.

Now on oxide 41 is formed over the polysilicon strips 38 and a second layer of polysilicon is deposited on the substrate. This layer is etched to form elongated, parallel, spaced-apart polysilicon strips which are generally perpendicular to the source and drain regions. The strips 42 (which are the word lines in the memory array) are best seen in the plan view of FIG. 8. The elongated strips 38 formed from the first layer of polysilicon are now etched in alignment with the strips 42, thereby forming a plurality of floating gates. The resultant memory devices and the layout of the array is best seen in FIGS. 7 and 8. "S/OX" represents buried source regions and D/OX layers buried drain regions.

Passivation layers and contacts are formed in an ordinary manner to complete the memory.

The cells are programmed by applying a voltage to the drain region of 4–7 volts while the control gate (lines 42) are brought to a relatively high voltage (10–15 volts). To erase the floating gates, that is, to tunnel the charge from the floating gate, a high voltage (10–15 volts) is applied to the source regions while the drain regions are floating and control gates are at a low potential. For a more complete discussion of the erasing of such devices, see copending application, "Self-Limiting Erase Scheme for EEPROM", Ser. No. 039,086, Filed Apr. 16, 1987 and assigned to the assignee of the present application.

As can be seen in FIG. 8, the array of electrically erasable and programmable cells includes the parallel source and drain regions 34 and 35. With the above-described processing, the drain regions are sharply defined (abrupt, shallow junctions), thereby providing good programming efficiency, In contrast, the source regions are graded for improved junction breakdown. The source and drain regions are asymmetrical and dedicated for their respective function. The contacts 11 of FIG. 1 are not required for each cell, thereby reducing the area needed for fabrication. The field isolation "rounding" problem discussed in conjunction with FIG. 1 does not exist due to the parallel nature of the source and drain regions. With the devices of the present invention, there can be no asymmetry in the source region/floating gate tunneling area and hence, no erasing asymmetry. Another advantage to the present invention is that the floating gate tunneling area (gate oxide) is fully covered by the first layer of polysilicon after its formation and thus the gate oxide is less susceptible to degradation during subsequent processing.

Thus, a one transistor floating gate electrically erasable and electrically programmable read-only memory cell has been described fabricated with a self-aligned process.

We claim:

1. A process for fabricating an array of floating gate memory devices on a substrate comprising the steps of:
    forming elongated, spaced-apart, parallel strips of silicon nitride over first regions of said substrate, said strips of silicon nitride defining elongated, parallel, spaced-apart second substrate regions between said strips;
    doping said second regions between said strips such that alternate ones of said second regions are doped with an n-type dopant to a first level of doping and the others of said second regions are doped with an n-type dopant to a second level of doping, said first level of doping being different than said second level of doping;
    growing an oxide region at said second regions;
    forming a plurality of first gate members from a first layer of polysilicon, said first gate members being disposed over said first regions and being insulated from said first regions;
    forming elongated second gate members from a second layer of polysilicon, said second gate members being formed over said first gate members and being insulated from first gate members, said second gate members being generally perpendicular to said first and second regions,
    whereby memory devices are realized.

2. The process defined by claim 1 including the step of growing an oxide layer over said first regions before forming said first gates, said oxide layer being approximately 120Å thick.

3. The process defined by claim 2 wherein said doping step comprises the steps of:
    implanting an arsenic dopant into all of said first regions;
    implanting a phosphorus dopant into alternate ones of said first regions.

4. A process for fabricating an array of floating gate memory devices on a substrate comprising the steps of:
    forming elongated, spaced-apart, parallel strips of silicon nitride over first regions of said substrate, said strips of silicon nitride defining elongated, parallel, spaced-apart second substrate regions between said strips;
    doping said second regions between said strips such that alternate ones of said second regions are doped with an n-type dopant to a first depth and the others of said second regions are doped with an n-type dopant to a second depth, said first depth being greater than said second depth;
    growing an oxide region at said second regions;
    removing said silicon nitride strips;
    forming a plurality of first gate members from a first layer of polysilicon, said first gate members being disposed over said first regions and being insulated from said first regions;
    forming elongated second gate members from a second layer of polysilicon, said second gate members being formed over said first gate members and being insulated from first gate members, said second gate members being generally perpendicular to said first and second regions,
    whereby memory devices are realized.

5. The process defined by claim 4 including the step of growing an oxide over said first regions before forming said first gates, said oxide being approximately 120Å thick.

6. The process defined by claim 5 wherein said doping step comprises the steps of:
- implanting an arsenic dopant into all of said first regions;
- implanting a phosphorus dopant into alternate ones of said first regions.

7. A process for fabricating an array of floating gate memory devices on a substrate comprising the steps of:
- forming elongated, spaced-apart, parallel strips of silicon nitride over first elongated regions of said substrate, said strips of silicon nitride defining elongated, parallel, spaced-apart second substrate regions between said strips;
- doping said first and second regions with a n-type dopant;
- covering alternate ones of said second substrate regions;
- doping the others of said n-type regions so that said others of said n-type regions are more heavily doped with an n-type dopant;
- growing an oxide region over said second regions;
- removing said silicon nitride strips;
- forming a plurality of first elongated polysilicon members from a first layer of polysilicon over said first regions;
- forming elongated second gate members from a second layer of polysilicon, said second gate members being formed over said first members, said second members being generally perpendicular to first members;
- etching said first elongated members in alignment with said second elongated members so as to form floating gate members disposed between said second members and said substrate, whereby memory devices are realized.

8. The process defined by claim 7 wherein the first of said doping step comprises the implantation of arsenic and the second of said doping step comprises the implantation of phosphorus.

9. The process defined by claim 8 including the step of growing an oxide over said first regions before forming said first elongated polysilicon members, said oxide being approximately 120Å thick.

* * * * *